(12) United States Patent
Yamamoto et al.

(10) Patent No.: US 6,235,144 B1
(45) Date of Patent: May 22, 2001

(54) RESIST REMOVING APPARATUS AND METHOD

(75) Inventors: Masayuki Yamamoto; Makoto Namikawa; Eiji Toyoda; Shigeji Kuroda; Saburo Miyamoto; Takao Matsushita, all of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/203,263

(22) Filed: Dec. 1, 1998

(30) Foreign Application Priority Data

Dec. 15, 1997 (JP) .................................................. 9-344621

(51) Int. Cl.[7] .................................................. B32B 35/00
(52) U.S. Cl. ...................... 156/344; 156/247; 156/272.2; 156/584
(58) Field of Search .................................. 156/344, 584, 156/247, 272.2

(56) References Cited

U.S. PATENT DOCUMENTS

| | | | |
|---|---|---|---|
| 4,341,592 | * 7/1982 | Shortes et al. .............................. 134/2 |
| 5,246,526 | * 9/1993 | Yamaguchi et al. ................... 156/345 |
| 5,370,846 | * 12/1994 | Yokomi et al. ................... 422/186.07 |
| 5,466,325 | * 11/1995 | Mizuno et al. ........................ 156/344 |
| 5,651,860 | * 7/1997 | Li ........................................... 438/705 |
| 5,759,336 | 6/1998 | Yamamoto et al. . |
| 6,099,675 | * 8/2000 | Yamamoto et al. .................. 156/241 |

FOREIGN PATENT DOCUMENTS 6-267893 * 9/1994 (JP) .

* cited by examiner

Primary Examiner—Mark A. Osele
(74) Attorney, Agent, or Firm—Arent Fox Kintner Plotkin & Kahn, PLLC

(57) ABSTRACT

A resist removing apparatus for removing an unwanted resist pattern from a surface of wafer W by applying an adhesive tape to the surface of wafer W having the resist patterns formed thereon, and separating the adhesive tape from the surface of wafer W. The apparatus includes an adhesive removing mechanism 13 for treating the surface of wafer W after the adhesive tape is separated therefrom. The adhesive removing mechanism 13 may be effective when constructed to jet ozone to the surface of wafer W heated, to irradiate the surface of wafer W heated, with ultraviolet rays, or to jet ozone to the surface of wafer W heated and irradiate the surface with ultraviolet rays.

13 Claims, 6 Drawing Sheets

RESIST REMOVING APPARATUS AND METHOD

BACKGROUND OF THE INVENTION

1. Field of the Invention

This invention relates to apparatus for and methods of removing, in time of manufacture, resist patterns which have become unnecessary from surfaces of articles such as semiconductor wafers, glass substrates for photo masks, glass substrates for liquid crystal displays and substrates for optical disks.

2. Description of the Related Art

When manufacturing a semiconductor device, for example, a resist solution is applied to a semiconductor substrate such as a silicon wafer. A predetermined resist pattern is formed thereon through a usual photographic process. The resist pattern is used as a mask in various processes including ion injection, etching and doping. Subsequently, the resist pattern no longer needed is removed to form a predetermined circuit. Then, the resist solution is applied again to form a next circuit. This cycle is repeated. Generally, unnecessary resist patterns are removed by oxygen plasma ashing or by treatment with an organic solvent.

When resist patterns are removed by ashing, the operation may be time-consuming, and impurity ions in the resist could mix into the semiconductor substrate. Use of the organic solvent poses the problem of impairing work environment.

A method of removing unnecessary resist patterns without the above-noted inconveniences has been proposed as disclosed in U.S. Pat. No. 5,759,336, for example. With this method, adhesive tape is applied to a surface of a resist pattern on a substrate, and this adhesive tape is separated along with the resist pattern from the substrate.

The above method of removing resist patterns with adhesive tape has the advantage of removing unwanted resist patters without contaminating substrates with impurities as in the conventional ashing technique. However, this method has the following drawback.

When a resist pattern is removed with adhesive tape, the adhesive may remain, though in a small quantity, on a substrate surface. Such adhesive remnants could adversely affect the subsequent wafer processing.

SUMMARY OF THE INVENTION

This invention has been made having regard to the state of the art noted above, and its object is to provide an apparatus for and a method of reliably removing unnecessary resist patterns with adhesive tape from articles such as semiconductor wafers, without leaving adhesive remnants on the articles.

The above object is fulfilled, according to this invention, by a resist removing apparatus for removing a resist pattern from a surface of an article by applying an adhesive tape to the surface of the article having the resist pattern formed thereon, and separating the adhesive tape from the surface of the article, the apparatus comprising an adhesive tape applying mechanism for applying the adhesive tape to the surface of the article, an adhesive tape separating mechanism for separating the adhesive tape from the surface of the article, and an adhesive removing mechanism for removing adhesive remnants left on the surface of the article after the adhesive tape is separated therefrom.

According to this invention, the adhesive tape applying mechanism first applies the adhesive tape to the surface of the article, and then the adhesive tape separating mechanism separates the adhesive tape from the surface of the article. The unwanted resist pattern is separated along with the adhesive tape from the surface of the article. Subsequently, the article receives treatment in the adhesive removing mechanism to have remnants of the adhesive removed from the surface of the article. Thus, remnants of the adhesive of the adhesive tape left on the surface of the article, if any, are removed therefrom reliably. This apparatus carries out a process of removing the unwanted resist pattern with the adhesive tape with increased effect.

Preferably, the adhesive removing mechanism includes a heater for heating the article, and an ozonic atmosphere generator for providing an ozonic atmosphere for the surface of the article. With this construction, the surface of the article heated contacts ozone. Consequently, the adhesive remnants are eliminated from the surface of the article by the oxidizing and decomposing action of ozone.

It is also preferred that the adhesive removing mechanism includes a heater for heating the article, and an ultraviolet irradiating mechanism for irradiating the surface of the article with ultraviolet rays. With this construction, the surface of the article heated is irradiated with ultraviolet rays. Consequently, the adhesive remnants are decomposed and eliminated from the surface of the article by ultraviolet rays.

Further, it is preferred that the adhesive removing mechanism includes a heater for heating the article, an ozonic atmosphere generator for providing an ozonic atmosphere for the surface of the article, and an ultraviolet irradiating mechanism for irradiating the surface of the article with ultraviolet rays in the ozonic atmosphere. The article is heated, and the article surface is placed in an ozonic atmosphere and irradiated with ultraviolet rays. With this construction, the surface of the article heated contacts ozone and is irradiated with ultraviolet rays. Consequently, the adhesive remnants are eliminated from the surface of the article simply and effectively by the oxidizing action of ozone and the decomposing action of ultraviolet rays.

In another aspect of this invention, there is provided a resist removing method for removing a resist pattern from a surface of an article by applying an adhesive tape to the surface of the article having the resist pattern formed thereon, and separating the adhesive tape from the surface of the article. This method comprises the steps of applying the adhesive tape to the surface of the article, heating the article having the adhesive tape applied thereto, cooling the article heated, separating the adhesive tape from the surface of the article cooled, and removing adhesive remnants left on the surface of the article after the adhesive tape is separated therefrom.

According to this method, the article is heated after the adhesive tape is applied thereto. Consequently, the adhesive of the adhesive tape flows into recesses of the resist pattern on the article surface, thereby enlarging an area of contact between the adhesive and resist pattern. The article is thereafter cooled, and then the adhesive tape is separated. Thus, curing of the adhesive is promoted to facilitate resist separation. After the adhesive tape is separated, remnants of the adhesive are removed from the surface of the article. Such a method facilitates resist separation, and efficiently removes the adhesive remnants from the surface of the article.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
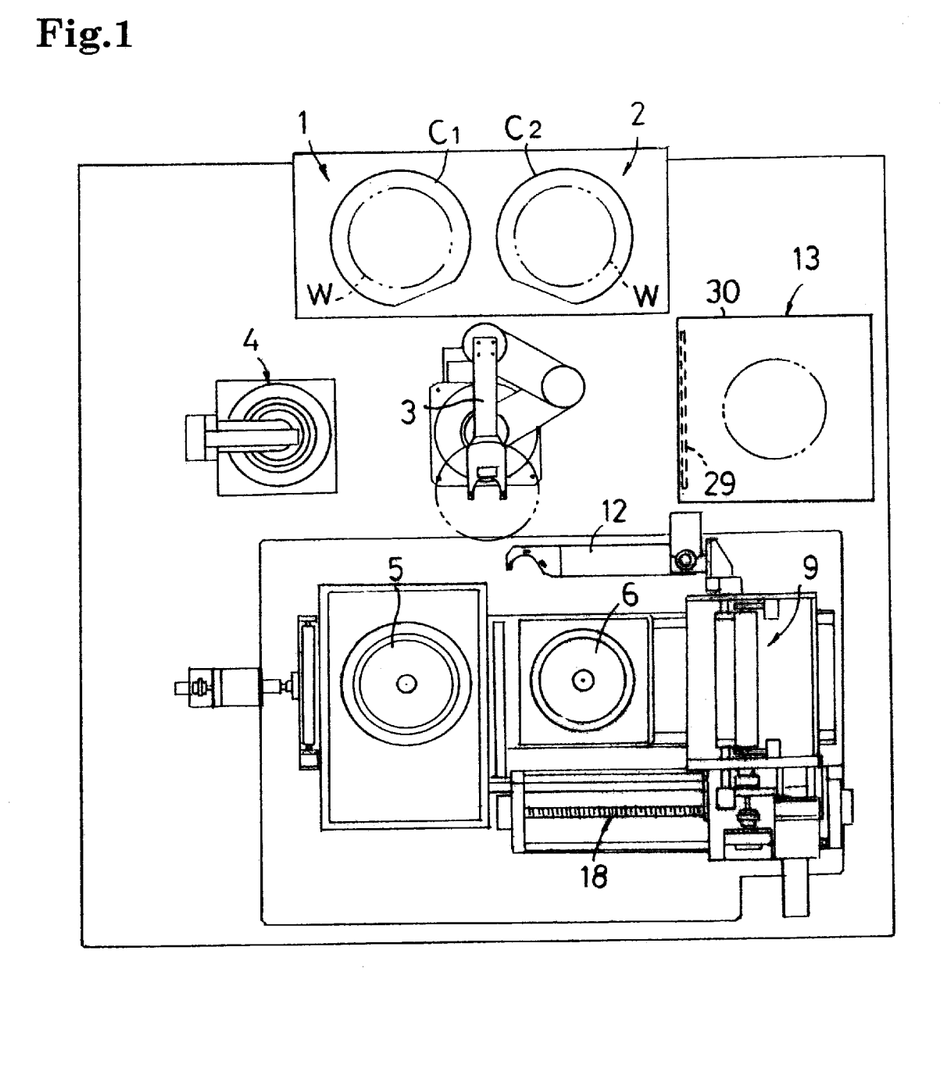
FIG. 1 is an overall plan view of a resist removing apparatus according to this invention.
Figure 2:
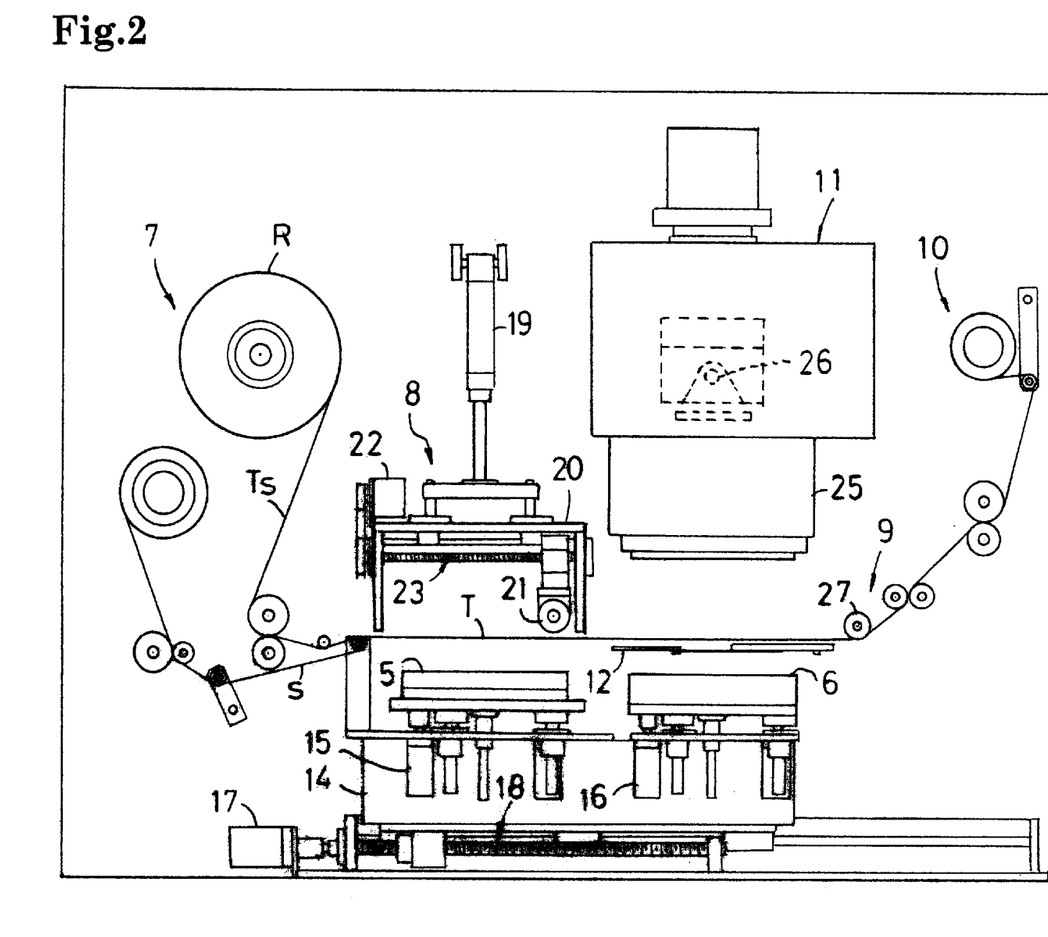
FIG. 2 is an overall front view of the resist removing apparatus.

FIG. 1 is an overall plan view of a resist removing apparatus according to this invention. FIG. 2 is an overall front view of the apparatus. The apparatus includes a wafer supplying station 1, a wafer collecting station 2, a wafer transporting robot arm 3, an alignment stage 4 for adjusting positions of wafers W, an applicator table 5 for applying adhesive tape, a separator table 6 for separating the adhesive tape, a tape server 7, a tape applying mechanism 8, a tape separating mechanism 9, a tape collector 10, an ultraviolet irradiating unit 11, a wafer transfer arm 12 and an adhesive removing mechanism 13.

The wafer supplying station 1 receives a cassette C containing wafers W stacked in horizontal posture therein with surfaces to be treated facing upward. The wafer collecting station 2 has a cassette C2 for storing, as stacked in horizontal posture, wafers W after a resist removing process.

The robot arm 3 is pivotable and flexible to take wafers W from the wafer supplying station 1, supply the wafers W to the alignment stage 4, transfer the wafers W from the alignment stage 4 to the applicator table 5, transfer the wafers W to the adhesive removing mechanism 13, and transfer treated wafers W to the wafer collecting station 2.

The applicator table 5 and separator table 6 are arranged right and left on a common movable frame 14. The two tables 5 and 6 are vertically movable independently of each other by cylinders 15 and 16. The movable frame 14 are reciprocable by a predetermined amount right and left by a screw feed mechanism 18 driven backward and forward by a motor 17.

The tape server 4 draws adhesive tape Ts with a separator "s" from a stock roll R, and separates and takes up the separator "s" from the adhesive tape Ts. The adhesive tape T with an adhesive surface facing down is passed over the applicator table 5 and separator table 6 to the tape separating mechanism 9. The adhesive tape T used in this embodiment is the ultraviolet curable type.

The tape applying mechanism 8 includes an applicator roller 21 attached to a movable frame 20 vertically movable by a cylinder 19. The applicator roller 21 is horizontally reciprocable right and left by a screw feed mechanism 23 driven backward and forward by a motor 22.

A process of removing an unwanted resist pattern from the surface of a wafer W will be described hereinafter with reference to FIGS. 3 and 4.

First, the robot arm 3 suction-supports and takes one wafer W out of a supply cassette C1 at the wafer supplying station 1, and transfers the wafer onto the alignment stage 4. At the alignment stage 4, a positional adjustment of wafer W is carried out based on detection of an orientation flat and/or a notch of wafer W.

Figure 3A:
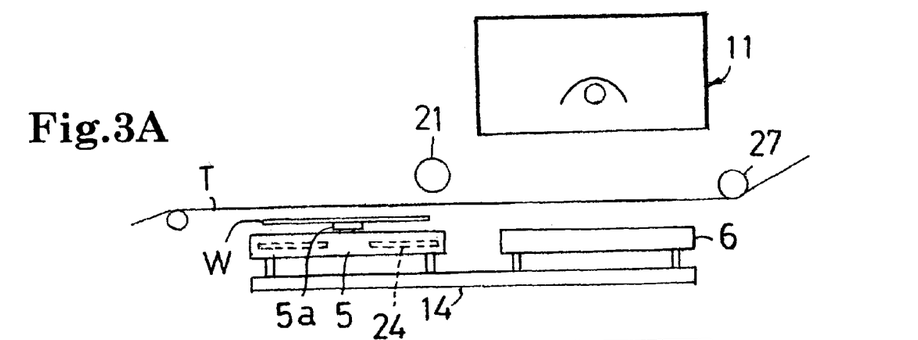
FIGS. 3A through 3D are explanatory views of a process of removing an unwanted resist pattern.

After the positional adjustment, the wafer W is supported by the robot arm 3 again and supplied to the applicator table 5. As shown in FIG. 3A, a suction pad 5a in a protruding standby position centrally of the applicator table 5. After the wafer W is transferred to the suction pad 5a, the suction pad 5a is retracted downward to leave the wafer W in a fixed posture on the applicator table 5. The applicator table 5 has a vacuum suction surface, and a heater 24 mounted therein for appropriately heating the wafer W.

Figure 3B:
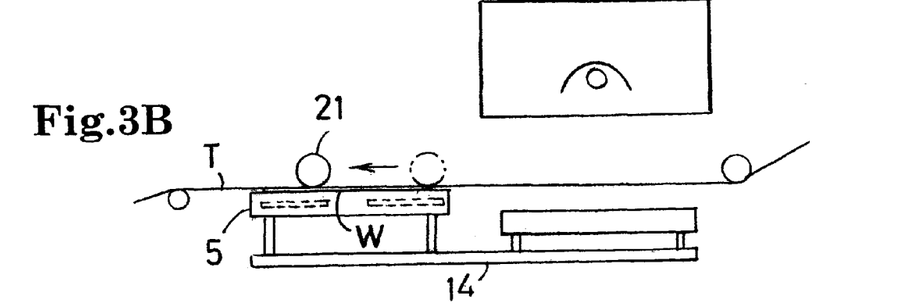

The applicator table 5 suction-supporting the wafer W is raised toward the lower surface (adhesive surface) of adhesive tape T. Subsequently, as shown in FIG. 3B, the tape applying mechanism 8 is lowered, and the applicator roller 21 thereof is driven to roll forward while pressing the adhesive tape T against the surface of wafer W, thereby applying the adhesive tape T to the surface of wafer W. At this time, the applicator table 5 is heated to approximately 150–200° C., whereby the adhesive of adhesive tape T becomes soft and flows into recesses of the resist pattern on the surface of wafer W. In this way, an area of contact between the adhesive and the resist pattern is enlarged.

Figure 3C:
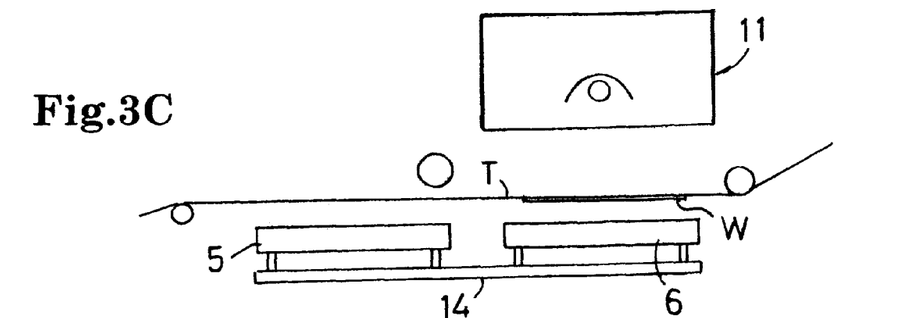

When the application of adhesive tape T to the wafer W is completed, the adhesive tape T is moved a predetermined amount toward the tape collector 10. As a result, the wafer W attached to the adhesive tape T is positioned over the separator table 6 as shown in FIG. 3C.

Figure 3D:
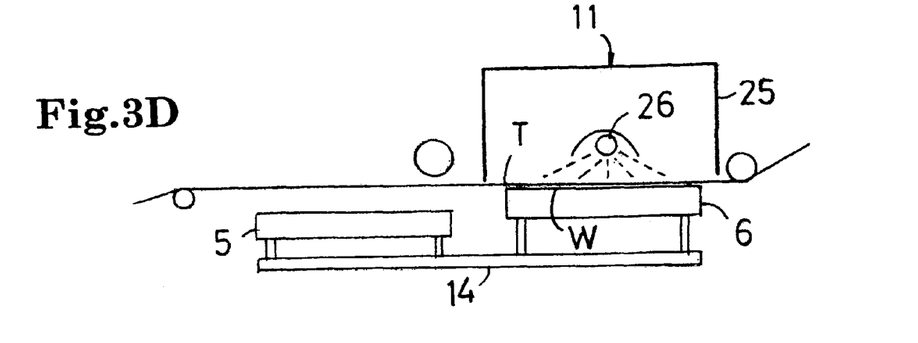

Next, as shown in FIG. 3D, the separator table 6 is raised and suction-supports, from below, the wafer W attached to the adhesive tape T, and the ultraviolet irradiating mechanism 11 is lowered. With a hood 25 covering an area over the separator table 5, ultraviolet rays are emitted from an ultraviolet lamp 26. With the ultraviolet irradiation, the adhesive of adhesive tape T cures to promote its cohesion with the unwanted resist pattern on the wafer W. The separator table 6 may include a cooling mechanism mounted therein to cool the wafer W and adhesive tape T. This provision will promote curing of the adhesive of adhesive tape T to facilitate resist separation.

Figure 4E:
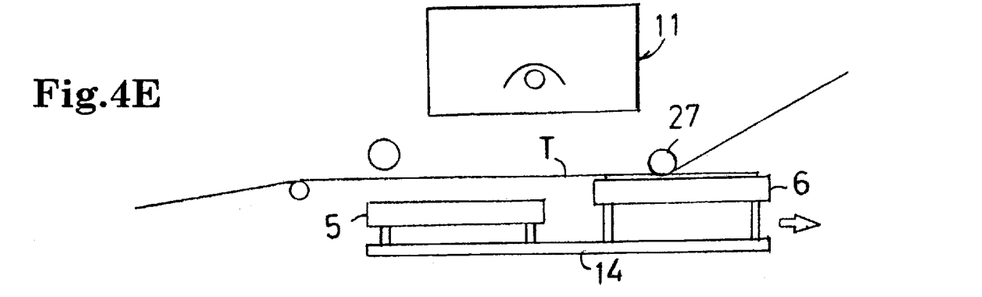
FIGS. 4E through 4H are explanatory views of the process of removing the unwanted resist pattern.
Figure 4F:
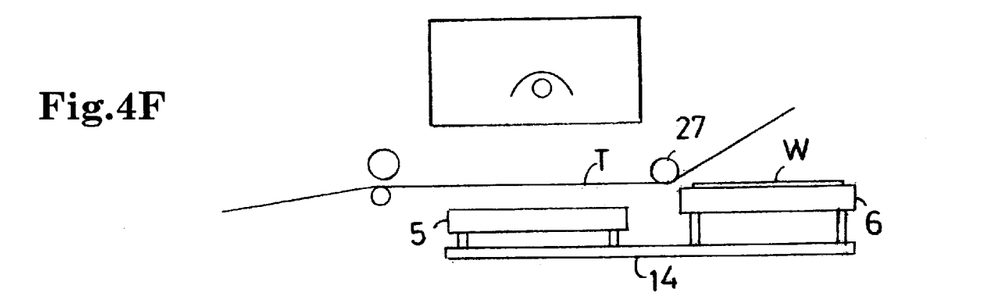

When the ultraviolet irradiation is completed, as shown in FIGS. 4E and 4F, the ultraviolet irradiating mechanism 11 is retracted upward, and the movable frame 14 is moved forward relative to the tape separating mechanism 9 to move the separator table 6 relative to a fixed separator roller 27. As a result, the adhesive tape T is separated from the wafer W suction-supported by the separator table 6. The unwanted resist pattern is separated along with the adhesive tape T from the wafer W.

Figure 4G:
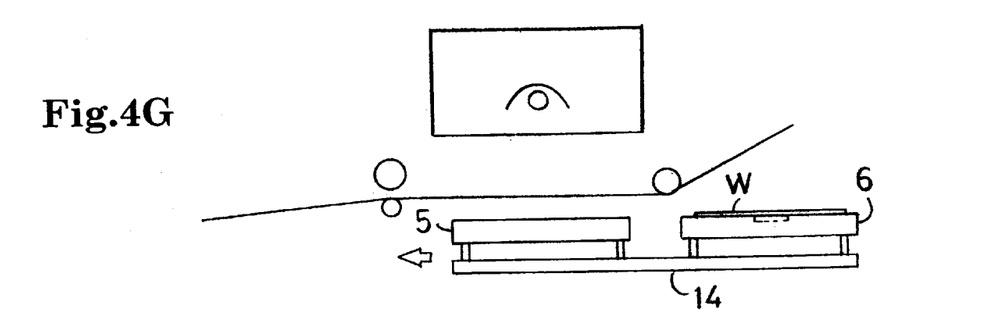

After the adhesive tape T is separated from the wafer as shown in FIG. 4G, the separator table 6 is lowered, and the movable frame 14 is returned to an original position.

Figure 4H:
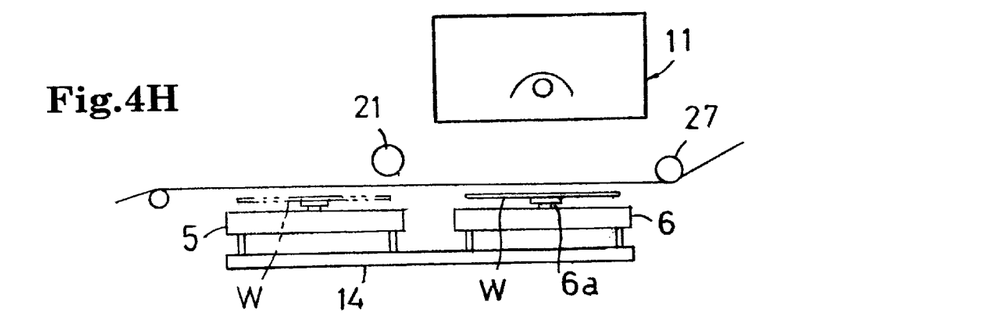

Once the movable frame 14 has returned to the original position, as shown in FIG. 4H, a suction pad 6a disposed centrally of the separator table 6 is projected upward to raise the wafer W above the separator table 6. The wafer transfer arm 12 unloads the wafer W from the separator table 6. At this time, a new wafer W is supplied to the applicator table 5.

The wafer W unloaded from the separator table 6 is transferred to the robot arm 3 again. The robot arm 3 loads the wafer W into the adhesive removing mechanism 13 where the following cleaning treatment is carried out.

Figure 5:
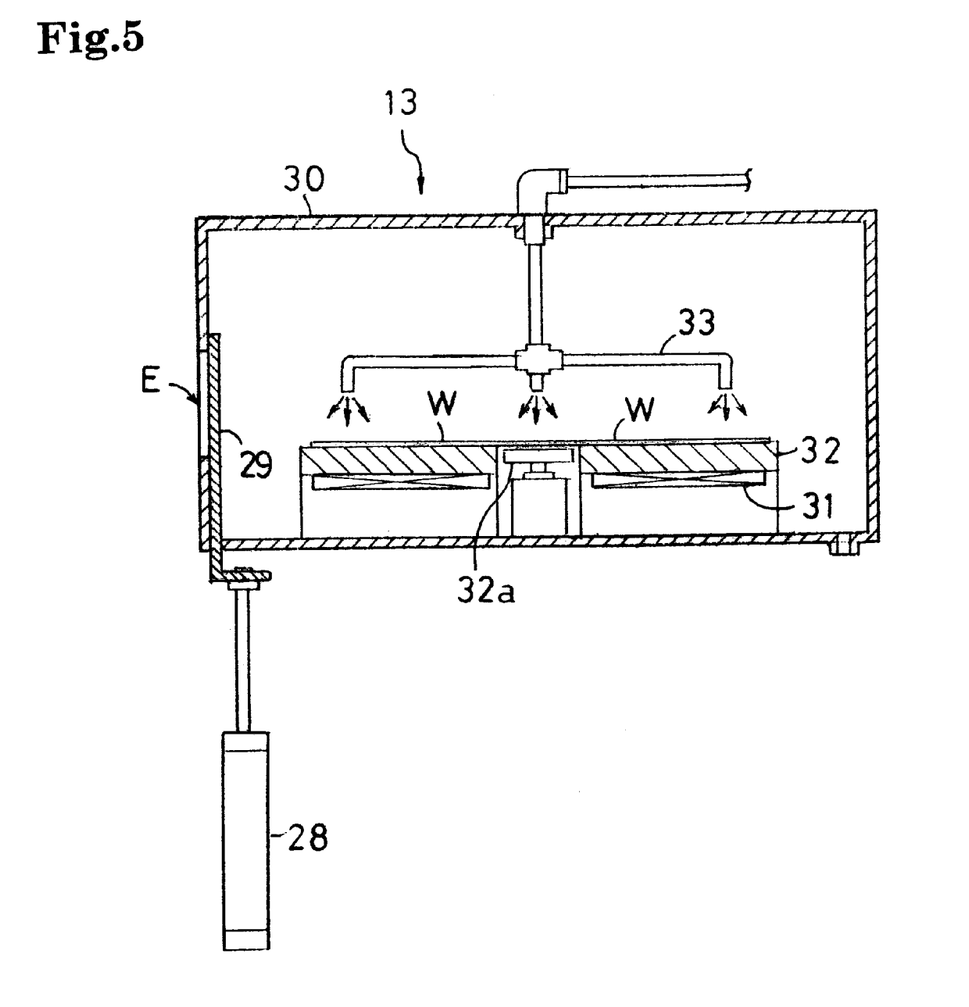
FIG. 5 is a front view in vertical section of an adhesive removing mechanism.

As shown in FIG. 5, the adhesive removing mechanism 13 includes a chamber 30 having an entrance E opened and closed with a shutter 29 driven by a cylinder 28, and a treatment table 32 having a heater 31 and ozone jet nozzles 33 arranged inside the chamber 30. The chamber 30 may be omitted from the adhesive removing mechanism 13.

The wafer W brought into the chamber 30 by the robot arm 3 is supported on the treatment table 32 through a suction pad 32a vertically movable at the table center, and is heated by the heater 31. Ozone in appropriate concentration supplied from an ozone generating device not shown is jetted toward the wafer surface for an appropriate time. As a result, adhesive remnants of adhesive tape T on the surface of wafer W, if any, are oxidized and decomposed through contact with ozone to be eliminated from the surface of wafer W.

It has been found that remnants of unwanted resist and adhesive tape T are completely removed from the surface of wafer W by jetting ozone in a concentration of 1000 ppm for approximately 40 seconds while heating the wafer W to approximately 200° C.

The wafer W stripped of adhesive remnants is transported out of the adhesive removing mechanism 13 and stored in the collecting cassette C2 at the wafer collecting station 2 by the robot arm 3.

Figure 6:
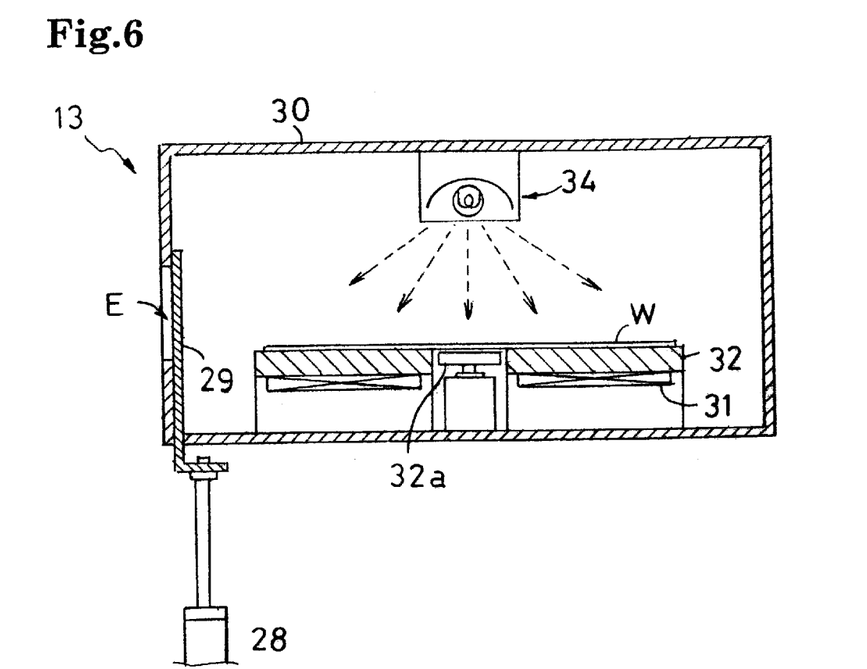
FIG. 6 is a front view in vertical section of a modified adhesive removing mechanism.

The adhesive removing mechanism 13 may be modified as follows:

(1) As shown in FIG. 6, the adhesive removing mechanism 13 includes a chamber 30 having an entrance E opened and closed with a shutter 29 driven by a cylinder 28, and a treatment table 32 having a heater 31 and an ultraviolet irradiating mechanism 34 arranged inside the chamber 30. Adhesive remnants of adhesive tape T are decomposed and eliminated from the surface of wafer W by irradiating the wafer W with ultraviolet rays while heating the wafer W.

Figure 7:
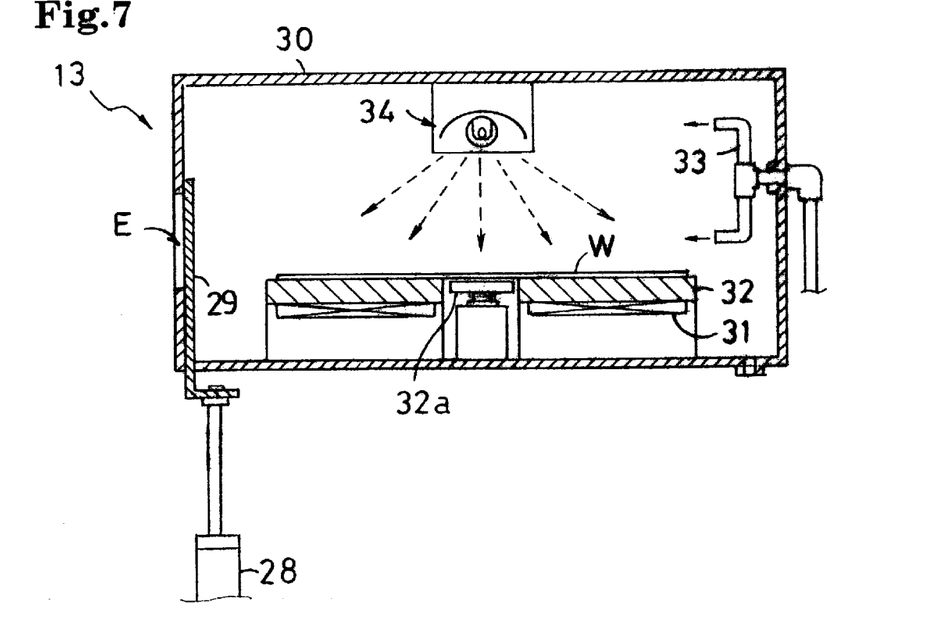
FIG. 7 is a front view in vertical section of another modified adhesive removing mechanism.

(2) As shown in FIG. 7, the adhesive removing mechanism 13 includes a chamber 30 having an entrance E opened and closed with a shutter 29 driven by a cylinder 28, and a treatment table 32 having a heater 31, ozone jet nozzles 33 and an ultraviolet irradiating mechanism 34 arranged inside the chamber 30. Adhesive remnants of adhesive tape T may be decomposed and eliminated from the surface of wafer W with increased effect by irradiating the wafer with ultraviolet rays in an ozonic atmosphere while heating the wafer W.

In the described embodiments, ozone jet nozzles 33 are arranged in the chamber 30 to treat the wafer W inside the chamber 30. This invention is not limited to such embodiments. It is possible to employ a construction without the chamber 30, for example. The foregoing embodiments have been described, taking semiconductor wafers for example. This invention is not limited thereto but is applicable to glass substrates for photo masks, glass substrates for liquid crystal displays and substrates for optical disks.

The present invention may be embodied in other specific forms without departing from the spirit or essential attributes thereof and, accordingly, reference should be made to the appended claims, rather than to the foregoing specification, as indicating the scope of the invention.

What is claimed is:

1. A resist removing apparatus for removing a resist pattern from a surface of an article by applying an adhesive tape to the surface of the article having the resist pattern formed thereon, and separating the adhesive tape from the surface of the article, said apparatus comprising:

an adhesive tape applying mechanism for applying said adhesive tape to said surface of said article;

an adhesive tape separating mechanism for separating said adhesive tape from said surface of said article; and an adhesive removing mechanism for removing adhesive remnants left on said surface of said article after said adhesive tape is separated therefrom, wherein said adhesive removing mechanism includes:

heating means for heating said article; and ozonic atmosphere generating means for providing an ozonic atmosphere for said surface of said article.

2. A resist removing apparatus as defined in claim 1, wherein said ozonic atmosphere generating means includes ozone jet means for jetting ozone to said surface of said article.

3. A resist removing apparatus as defined in claim 1, wherein said ozonic atmosphere generating means includes:

a chamber for defining a closed space surrounding said article; and ozone jet means for jetting ozone in said chamber.

4. A resist removing apparatus as defined in claim 1, wherein said ozonic atmosphere generating means includes:

a chamber for defining a closed space surrounding said article; and ozone jet means for jetting ozone to said surface of said article in said chamber.

5. A resist removing apparatus as defined in claim 4, wherein said ozone jet means is operable to jet ozone in a concentration of approximately 1000 ppm for approximately 40 seconds to said surface of said article heated to approximately 200° C. by said heating means.

6. A resist removing apparatus as defined in claim 1, wherein said article is a semiconductor wafer.

7. A resist removing apparatus for removing a resist pattern from a surface of an article by applying an adhesive tape to the surface of the article having the resist pattern formed thereon, and separating the adhesive tape from the surface of the article, said apparatus comprising:

an adhesive tape applying mechanism for applying said adhesive tape to said surface of said article;

an adhesive tape separating mechanism for separating said adhesive tape from said surface of said article; and an adhesive removing mechanism for removing adhesive remnants left on said surface of said article after said adhesive tape is separated therefrom, wherein said adhesive removing mechanism includes:

heating means for heating said article; and ultraviolet irradiating means for irradiating said surface of said article with ultraviolet rays.

8. A resist removing apparatus for removing a resist pattern from a surface of an article by applying an adhesive tape to the surface of the article having the resist pattern formed thereon, and separating the adhesive tape from the surface of the article, said apparatus comprising:

an adhesive tape applying mechanism for applying said adhesive tape to said surface of said article;

an adhesive tape separating mechanism for separating said adhesive tape from said surface of said article; and an adhesive removing mechanism for removing adhesive remnants left on said surface of said article after said adhesive tape is separated therefrom, wherein said adhesive removing mechanism includes:

heating means for heating said article;

ozonic atmosphere generating means for providing an ozonic atmosphere for said surface of said article; and ultraviolet irradiating means for irradiating said surface of said article with ultraviolet rays in said ozonic atmosphere.

9. A resist removing apparatus as defined in claim 8, wherein said ozonic atmosphere generating means includes ozone jet means for jetting ozone to said surface of said article.

10. A resist removing apparatus as defined in claim 8 wherein said ozonic atmosphere generating means includes:

a chamber for defining a closed space surrounding said article; and ozone jet means for jetting ozone in said chamber.

11. A resist removing method for removing a resist pattern from a surface of an article by applying an adhesive tape to the surface of the article having the resist pattern formed thereon, and separating the adhesive tape from the surface of the article, said method comprising the steps of:

applying said adhesive tape to said surface of said article;

heating said article while said adhesive tape is applied thereto;

cooling said article heated;

separating said adhesive tape from said surface of said article cooled; and removing adhesive remnants left on said surface of said article after said adhesive tape is separated therefrom, wherein the step of removing adhesive remnants includes the steps of:

heating said article from which said adhesive tape has been separated; and providing an ozonic atmosphere for said surface of said article heated.

12. A resist removing method for removing a resist pattern from a surface of an article by applying an adhesive tape to the surface of the article having the resist pattern formed thereon, and separating the adhesive tape from the surface of the article, said method comprising the steps of:

applying said adhesive tape to said surface of said article;

heating said article while said adhesive tape is applied thereto;

cooling said article heated;

separating said adhesive tape from said surface of said article cooled; and removing adhesive remnants left on said surface of said article after said adhesive tape is separated therefrom, wherein the step of removing adhesive remnants includes the steps of:

heating said article from which said adhesive tape has been separated; and irradiating said surface of said article heated, with ultraviolet rays.

13. A resist removing method for removing a resist pattern from a surface of an article by applying an adhesive tape to the surface of the article having the resist pattern formed thereon, and separating the adhesive tape from the surface of the article, said method comprising the steps of:

applying said adhesive tape to said surface of said article;

heating said article while said adhesive tape is applied thereto;

cooling said article heated;

separating said adhesive tape from said surface of said article cooled; and removing adhesive remnants left on said surface of said article after said adhesive tape is separated therefrom, wherein the step of removing adhesive remnants includes the steps of:

heating said article from which said adhesive tape has been separated; and providing an ozonic atmosphere for said surface of said article heated, and irradiating said surface of said article with ultraviolet rays.

* * * * *